United States Patent
Shin et al.

(10) Patent No.: US 12,317,516 B2
(45) Date of Patent: May 27, 2025

(54) SEMICONDUCTOR DEVICE INCLUDING CAPACITORS AND MANUFACTURING METHOD THEREOF

(71) Applicant: SK hynix Inc., Icheon-si (KR)

(72) Inventors: Hyun Soo Shin, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 368 days.

(21) Appl. No.: 17/867,084

(22) Filed: Jul. 18, 2022

(65) Prior Publication Data

US 2023/0268379 A1 Aug. 24, 2023

(30) Foreign Application Priority Data

Feb. 21, 2022 (KR) .................... 10-2022-0022411

(51) Int. Cl.
*H10D 1/00* (2025.01)
*H10B 43/27* (2023.01)
*H10B 43/40* (2023.01)
*H10D 1/68* (2025.01)

(52) U.S. Cl.
CPC ............ *H10D 1/042* (2025.01); *H10B 43/40* (2023.02); *H10D 1/043* (2025.01); *H10D 1/714* (2025.01); *H10D 1/716* (2025.01); *H10B 43/27* (2023.02)

(58) Field of Classification Search
CPC ......... H01L 28/87; H01L 28/88; H01L 28/91; H01L 28/90; H10B 43/40; H10B 43/27; H10B 12/30; H10B 12/03; H10B 12/50; H10D 1/042; H10D 1/043; H10D 1/714; H10D 1/716

See application file for complete search history.

(56) References Cited

U.S. PATENT DOCUMENTS

| 8,343,845 | B2* | 1/2013 | Kim ....................... | H10D 1/042 257/296 |
| 8,810,002 | B2* | 8/2014 | Jou ......................... | H01G 13/00 361/303 |
| 2012/0161281 | A1* | 6/2012 | Hasunuma ........... | H10B 12/033 257/532 |
| 2013/0105874 | A1* | 5/2013 | Fujii ...................... | H10D 30/62 438/257 |
| 2013/0154055 | A1 | 6/2013 | Park et al. | |

(Continued)

FOREIGN PATENT DOCUMENTS

KR 10-2011-0013701 A 2/2011

*Primary Examiner* — Khaja Ahmad
*Assistant Examiner* — Khatib A Rahman

(57) ABSTRACT

A semiconductor device includes a stack including a plurality of electrode layers which include a plurality of capacitor first electrode layers and a plurality of capacitor second electrode layers alternately stacked on a substrate and a plurality of dielectric layers which are disposed alternately with the plurality of electrode layers; a first conductive pillar passing through the stack and coupled to the plurality of capacitor first electrode layers; a second conductive pillar passing through the stack and coupled to the plurality of capacitor second electrode layers; and a plurality of insulation layer patterns insulating the first conductive pillar and the plurality of capacitor second electrode layers from each other and insulating the second conductive pillar and the plurality of capacitor first electrode layers from each other.

14 Claims, 19 Drawing Sheets

(56) References Cited

U.S. PATENT DOCUMENTS

| | | | | |
|---|---|---|---|---|
| 2015/0318296 | A1* | 11/2015 | Kim | H10B 41/27 |
| | | | | 257/296 |
| 2016/0365352 | A1* | 12/2016 | Nishikawa | H01L 23/5226 |
| 2018/0144873 | A1* | 5/2018 | Lee | H01G 4/33 |
| 2018/0308857 | A1* | 10/2018 | Kim | H10B 43/40 |

* cited by examiner

SEMICONDUCTOR DEVICE INCLUDING CAPACITORS AND MANUFACTURING METHOD THEREOF

CROSS-REFERENCE TO RELATED APPLICATION

The present application claims priority under 35 U.S.C. § 119(a) to Korean Patent Application No. 10-2022-0022411, filed in the Korean Intellectual Property Office on Feb. 21, 2022, which is incorporated herein by reference in its entirety.

BACKGROUND

1. Technical Field

Various embodiments generally relate to a semiconductor technology, and particularly, to a semiconductor device including capacitors and a manufacturing method thereof.

2. Related Art

A memory device with a two-dimensional or planar structure has been developed to store more data in the same area by using a fine patterning process. However, as the line width of a circuit is narrowed due to the demand for high integration, interference between memory cells becomes severe, thereby causing various limitations such as degradation in performance. Of course, in addition to such structural limitations, there is a problem in that an increase in manufacturing cost is inevitable because the introduction of expensive equipment is required to pattern a fine line width.

As an alternative to overcome limitations of the two-dimensional memory device, a three-dimensional memory device has been proposed. A three-dimensional memory device has advantages in that a larger capacity may be realized within the same area by increasing the number of stacks through stacking memory cells in a vertical direction, thereby providing high performance and excellent power efficiency. For the operation of such a three-dimensional memory device, an increase in the capacitance of a capacitor is required.

SUMMARY

Various embodiments are directed to a semiconductor device including capacitors and a manufacturing method thereof.

In an embodiment, a semiconductor device may include: a stack including a plurality of electrode layers that include a plurality of capacitor first electrode layers and a plurality of capacitor second electrode layers alternately stacked on a substrate and a plurality of dielectric layers which are disposed between the capacitor first electrode layers and the capacitor second electrode layers; a first conductive pillar passing through the stack and coupled to the plurality of capacitor first electrode layers; a second conductive pillar passing through the stack and coupled to the plurality of capacitor second electrode layers; and a plurality of insulation layer patterns insulating the first conductive pillar and the plurality of capacitor second electrode layers from each other and insulating the second conductive pillar and the plurality of capacitor first electrode layers from each other.

In an embodiment, a semiconductor device may include: a first stack including a plurality of cell electrode layers and a plurality of interlayer dielectric layers that are alternately stacked on a cell region of a substrate; a plurality of cell plugs passing through the first stack to extend to the substrate; a second stack including a plurality of capacitor electrode layers that include a plurality of capacitor first electrode layers and a plurality of capacitor second electrode layers alternately stacked on a peripheral region of the substrate, and a plurality of dielectric layers that are disposed between alternating capacitor electrode layers; a plurality of first conductive pillars passing through the second stack, and coupled to the plurality of capacitor first electrode layers; a plurality of second conductive pillars passing through the second stack, and coupled to the plurality of capacitor second electrode layers; a plurality of first insulation layer patterns insulating the plurality of first conductive pillars and the plurality of capacitor second electrode layers from each other; and a plurality of second insulation layer patterns insulating the plurality of second conductive pillars and the plurality of capacitor first electrode layers from each other.

In an embodiment, a method for manufacturing a semiconductor device may include: forming a multi-layered stack by stacking, on a substrate, a plurality of unit structures in each of which a first interlayer dielectric layer, a first sacrificial layer, a second interlayer dielectric layer and a second sacrificial layer are stacked; forming a first hole and a second hole that pass through the multi-layered stack; forming a plurality of first recesses on a sidewall of the first hole by removing a plurality of second sacrificial layers that are adjacent to the first hole; forming a plurality of second recesses on a sidewall of the second hole by removing a plurality of first sacrificial layers that are adjacent to the second hole; forming insulation layer patterns in the plurality of first recesses and the plurality of second recesses; removing the plurality of first sacrificial layers and the plurality of second sacrificial layers; and forming an electrode material in spaces formed from removal of the pluralities of first and second sacrificial layers and the first and second holes.

DETAILED DESCRIPTION

Figure 1:
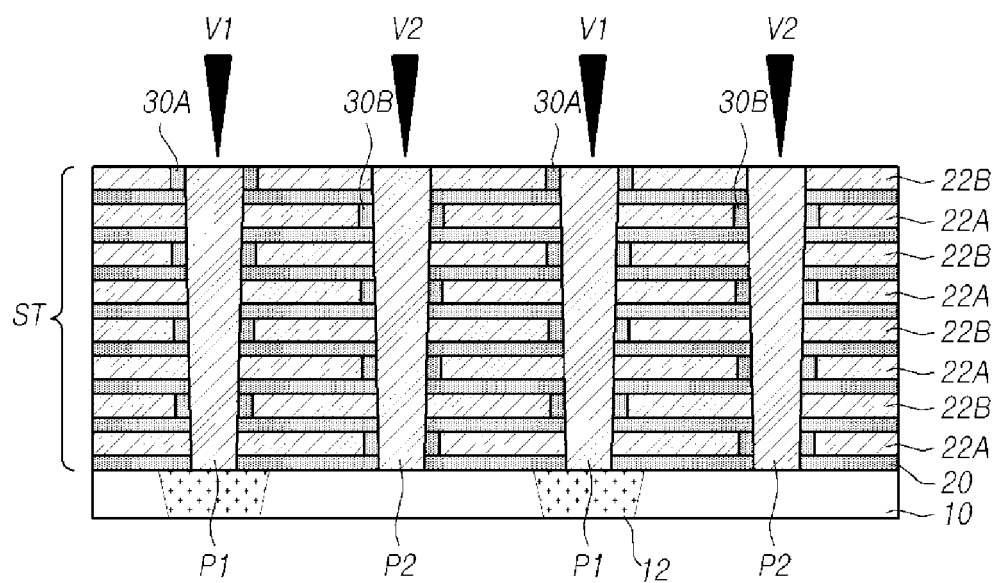
FIG. 1 is a cross-sectional view illustrating a semiconductor device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a cross-sectional view illustrating a semiconductor device in accordance with an embodiment of the present disclosure.

Referring to FIG. 1, a semiconductor device in accordance with an embodiment of the present disclosure may include a stack ST including a plurality of capacitor first electrode layers 22A and a plurality of capacitor second electrode layers 22B alternately stacked on a substrate 10 with a plurality of dielectric layers 20 disposed between the alternating capacitor first electrode layers 22A and capacitor second electrode layers 22B; first conductive pillars P1 passing through the stack ST and coupled to the plurality of capacitor first electrode layers 22A; second conductive pillars P2 passing through the stack ST and coupled to the plurality of capacitor second electrode layers 22B; and a plurality of insulation layer patterns 30 insulating the first conductive pillars P1 and the plurality of capacitor second electrode layers 22B from each other and insulating the second conductive pillars P2 and the plurality of capacitor first electrode layers 22A from each other.

The substrate 10 may include a semiconductor material, for example, a group IV semiconductor, a group III-V compound semiconductor or a group II-VI compound semiconductor. The group IV semiconductor may include silicon, germanium or silicon-germanium. The substrate 10 may be provided as a polysilicon layer or an epitaxial layer.

The stack ST may be configured as the plurality of dielectric layers 20 between alternately stacked capacitor first electrode layers 22A and capacitor second electrode layers 22B on the substrate 10. The plurality of electrode layers 22A and 22B may include the plurality of capacitor first electrode layers 22A and the plurality of capacitor second electrode layers 22B which are alternately disposed.

The dielectric layers 20 may include an insulation material, and the capacitor first and second electrode layers 22A and 22B may include a conductive material. For example, the dielectric layers 20 may include silicon oxide, and the capacitor first and second electrode layers 22A and 22B may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

Isolating insulation patterns 12 may be formed in the substrate 10. For example, the isolating insulation patterns 12 may vertically pass through the substrate 10. The first conductive pillar P1 may vertically pass through the stack ST to extend to the isolating insulation pattern 12, and the lower end of the first conductive pillar P1 may be coupled to the isolating insulation pattern 12. The second conductive pillar P2 may vertically pass through the stack ST to extend to the substrate 10, and the lower end of the second conductive pillar P2 may be coupled to the substrate 10.

The first and second conductive pillars P1 and P2 may include a conductive material. For example, the first and second conductive pillars P1 and P2 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

As will be described later with reference to FIG. 9I, the first and second conductive pillars P1 and P2 may be formed at the same process step as the capacitor first and second electrode layers 22A and 22B. Accordingly, the first and second conductive pillars P1 and P2 may be formed of the same material as the capacitor first and second electrode layers 22A and 22B.

The insulation layer patterns 30 may include first insulation layer patterns 30A and second insulation layer patterns 30B. The first insulation layer patterns 30A may serve to insulate the first conductive pillars P1 and the capacitor second electrode layers 22B, may be disposed at the same layers as the capacitor second electrode layers 22B correspondingly thereto, respectively, and may be configured in the form of rings that surround the outer walls of the first conductive pillars P1. The second insulation layer patterns 30B may serve to insulate the second conductive pillars P2 and the capacitor first electrode layers 22A, may be disposed at the same layers as the capacitor first electrode layers 22A corresponding thereto, respectively, and may be configured in the form of rings that surround the outer walls of the second conductive pillars P2.

As will be described later with reference to FIGS. 9E and 9F, the first insulation layer patterns 30A and the second insulation layer patterns 30B may be formed at the same process step. Accordingly, the first insulation layer patterns 30A and the second insulation layer patterns 30B may be formed of the same material. For example, the first insulation layer patterns 30A and the second insulation layer patterns 30B may be formed of silicon oxide.

A first voltage V1 may be applied to the first conductive pillars P1, and a second voltage V2 that is different from the first voltage V1 may be applied to the second conductive pillars P2. For example, the first voltage V1 may be a power supply voltage (Vcc), and the second voltage V2 may be a ground voltage (Vss).

The first voltage V1 may be applied to the plurality of capacitor first electrode layers 22A through the first conductive pillars P1, and the second voltage V2 may be applied to the plurality of capacitor second electrode layers 22B through the second conductive pillars P2. Each of the plurality of capacitor first electrode layers 22A may configure one electrode of a capacitor, and each of the plurality of capacitor second electrode layers 22B may configure the other electrode of a capacitor. Each of the plurality of dielectric layers 20 may configure a capacitor dielectric.

Although FIG. 1 illustrates a plurality of the first conductive pillars P1 and a plurality of the second conductive pillars P2, the present disclosure is not limited thereto. The number of the first conductive pillars P1 and the number of the second conductive pillars P2 may be at least 1.

Figure 2:
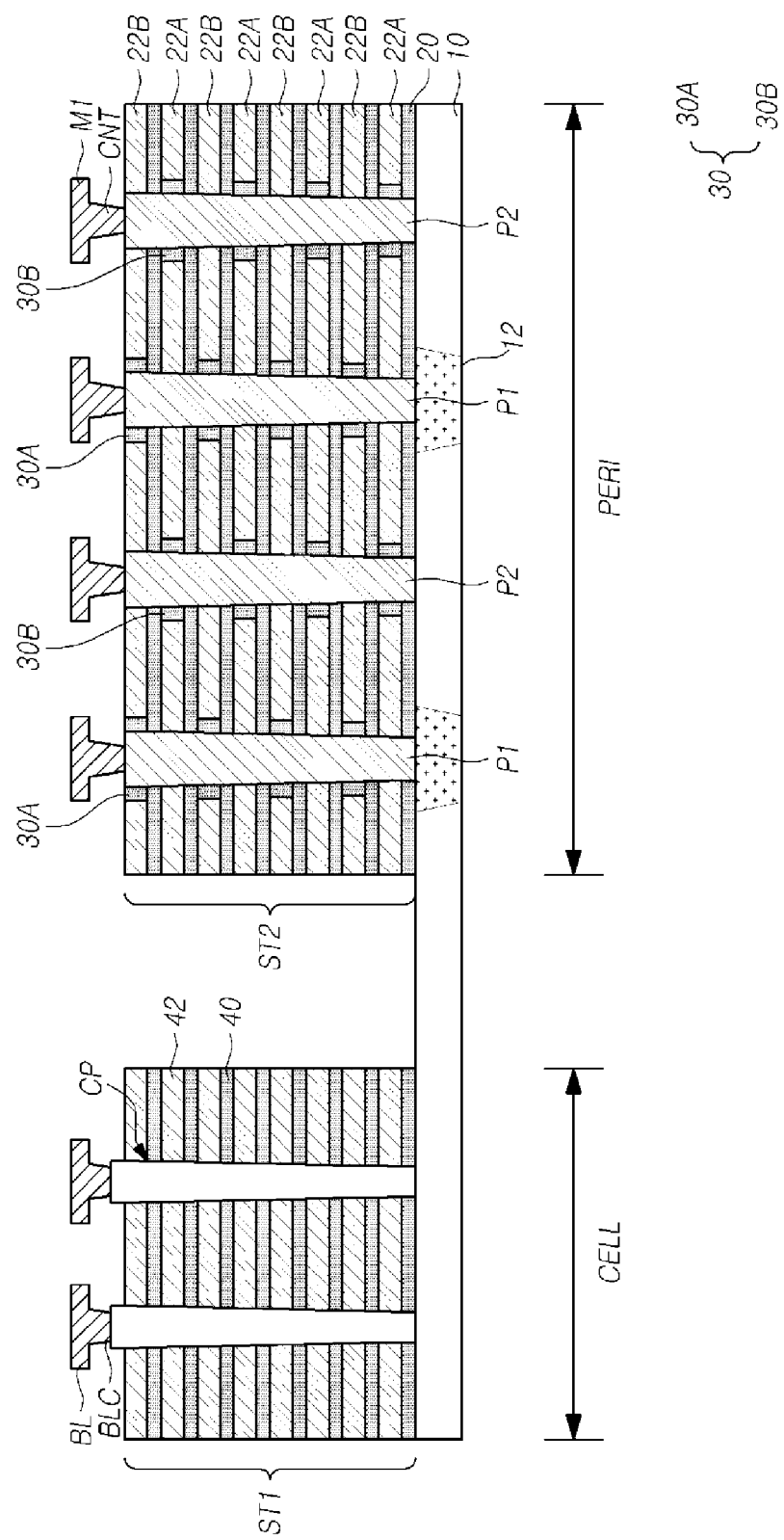
FIG. 2 is a cross-sectional view illustrating a semiconductor device in accordance with another embodiment of the present disclosure.

FIG. 2 is a cross-sectional view illustrating a semiconductor device in accordance with another embodiment of the present disclosure.

Referring to FIG. 2, a semiconductor device may include a first stack ST1 including a plurality of interlayer dielectric layers 40 and a plurality of cell electrode layers 42 that are alternately stacked on a cell region CELL of a substrate 10; a plurality of cell plugs CP passing through the first stack ST1 to extend to the substrate 10; a second stack ST2 including a plurality of capacitor first electrode layers 22A and a plurality of capacitor second electrode layers 22B alternately stacked on a peripheral region PERI of the substrate 10, and a plurality of dielectric layers 20 that are disposed between alternating capacitor first electrode layers 22A and capacitor second electrode layers 22B; a plurality of first conductive pillars P1 passing through the second stack ST2 and coupled to the plurality of capacitor first electrode layers 22A; a plurality of second conductive pillars P2 passing through the second stack ST2 and coupled to the plurality of capacitor second electrode layers 22B; a plurality of first insulation layer patterns 30A insulating the plurality of first conductive pillars P1 and the plurality of capacitor second electrode layers 22B from each other; and a plurality of second insulation layer patterns 30B insulating the plurality of second conductive pillars P2 and the plurality of capacitor first electrode layers 22A from each other.

The substrate 10 may include a semiconductor material, for example, a group IV semiconductor, a group III-V compound semiconductor or a group II-VI compound semiconductor. The group IV semiconductor may include silicon, germanium or silicon-germanium. The substrate 10 may be provided as a polysilicon layer or an epitaxial layer.

The substrate 10 or/and the semiconductor device may include the cell region CELL and the peripheral region PERI. The first stack ST1 may be configured with the plurality of interlayer dielectric layers 40 and the plurality of cell electrode layers 42 that are alternately stacked on the cell region CELL of the substrate 10.

The interlayer dielectric layers 40 may include an insulation material, and the cell electrode layers 42 may include a conductive material. For example, the interlayer dielectric layers 40 may include silicon oxide. The cell electrode layers 42 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

The cell electrode layers 42 may configure row lines. In detail, from among the cell electrode layers 42, at least one cell electrode layer 42 from the lowermost cell electrode layer 42 may configure a source select line. From among the cell electrode layers 42, at least one cell electrode layer 42 from the uppermost cell electrode layer 42 may configure a drain select line. The cell electrode layers 42 between the source select line and the drain select line may configure word lines.

The plurality of cell plugs CP that vertically pass through the first stack ST1 to extend to the substrate 10 may be configured in the cell region CELL. Although not illustrated in detail, each of the cell plugs CP may include a channel layer and a gate dielectric layer. The channel layer may include polysilicon or monocrystalline silicon, and may include, in some regions thereof, a P-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the cell plug CP. Memory cells may be configured in areas or regions where the word lines surround the cell plug CP. A drain select transistor may be configured in areas or regions where the drain select line surrounds the cell plug CP. The source select transistor, the memory cells and the drain select transistor that are disposed along one cell plug CP may configure one cell string.

A plurality of bit lines BL may be configured over the first stack ST1. A bit line contact BLC may be formed on each cell plug CP to couple the cell plug CP to a corresponding bit line BL.

The second stack ST2 may be configured as the plurality of dielectric layers 20 between alternately stacked capacitor first electrode layers 22A and capacitor second electrode layers 22B the substrate 10 in the peripheral region PERI. The plurality of capacitor electrode layers 22A and 22B may include the plurality of capacitor first electrode layers 22A and the plurality of capacitor second electrode layers 22B which are alternately disposed.

The dielectric layers 20 may be formed of the same material as the interlayer dielectric layers 40. For example, the dielectric layers may include silicon oxide. The dielectric layers 20 may be disposed at the same layers as the interlayer dielectric layers 40, respectively. A dielectric layer 20 and an interlayer dielectric layer 40 disposed at the same layer may be formed at the same processing step. Accordingly, the dielectric layer 20 and the interlayer dielectric layer 40 positioned at the same layer may have the same thickness.

The capacitor first and second electrode layers 22A and 22B may be formed at the same process step as the cell electrode layers 42. Accordingly, the capacitor first and second electrode layers 22A and 22B may be formed of the same material as the cell electrode layers 42. For example, the capacitor first and second electrode layers 22A and 22B may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

The first conductive pillars P1 and the second conductive pillars P2, which vertically pass through the second stack ST2, may be configured in the peripheral region PERI. The first conductive pillars P1 are coupled to the capacitor first electrode layers 22A and the second conductive pillars P2 are coupled to the capacitor second electrode layers 22B.

Isolating insulation patterns 12 may be formed in the substrate 10. For example, the isolating insulation patterns 12 may vertically pass through the substrate 10. The first conductive pillar P1 may vertically pass through the second stack ST2 to extend to the isolating insulation pattern 12, and the lower end of the first conductive pillar P1 may be coupled to the isolating insulation pattern 12. The second conductive pillar P2 may vertically pass through the second stack ST2 to extend to the substrate 10, and the lower end of the second conductive pillar P2 may be coupled to the substrate 10.

The first and second conductive pillars P1 and P2 may include a conductive material. As will be described later with reference to FIG. 9I, the first and second conductive pillars P1 and P2 may be formed at the same process step as the capacitor first and second electrode layers 22A and 22B and the cell electrode layers 42. Accordingly, the first and second conductive pillars P1 and P2 may be formed of the same material as the capacitor first and second electrode layers 22A and 22B and the cell electrode layers 42. For example, the first and second conductive pillars P1 and P2 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

Insulation layer patterns 30 may include the first insulation layer patterns 30A, which insulate the capacitor second electrode layers 22B and the first conductive pillars P1, and the second insulation layer patterns 30B, which insulate the capacitor first electrode layers 22A and the second conductive pillars P2.

The first insulation layer patterns 30A may be configured at the same layers as the capacitor second electrode layers 22B, and may each have a ring shape that surrounds the outer wall of a corresponding first conductive pillar P1. The capacitor second electrode layer 22B may be insulated from the first conductive pillars P1 by the first insulation layer patterns 30A, which are configured at the same layers as the capacitor second electrode layers 22B.

The second insulation layer patterns 30B may be configured at the same layers as the capacitor first electrode layers 22A, and may each have a ring shape that surrounds the outer wall of a corresponding second conductive pillar P2. The capacitor first electrode layer 22A may be insulated from the second conductive pillars P2 by the second insulation layer patterns 30B, which are configured at the same layers as the capacitor first electrode layers 22A.

As will be described later with reference to FIGS. 9E and 9F, the first insulation layer patterns 30A and the second insulation layer patterns 30B may be formed at the same process step. Accordingly, the first insulation layer patterns 30A and the second insulation layer patterns 30B may be formed of the same material. For example, the first insulation layer patterns 30A and the second insulation layer patterns 30B may include silicon oxide.

A contact CNT may be configured on each of the first and second conductive pillars P1 and P2, and a wiring line M1 may be coupled to the contact CNT. Voltages may be applied to the first and second conductive pillars P1 and P2 through wiring lines M1 and contacts CNT. A first voltage may be applied to the first conductive pillars P1, and a second voltage that is different from the first voltage may be applied to the second conductive pillars P2. For example, the first voltage may be a power supply voltage (Vcc), and the second voltage may be a ground voltage (Vss).

The first voltage may be applied to the plurality of capacitor first electrode layers 22A through the first conductive pillars P1, and the second voltage may be applied to the plurality of capacitor second electrode layers 22B through the second conductive pillars P2. Each of the plurality of capacitor first electrode layers 22A may configure one electrode of a capacitor, and each of the plurality of capacitor second electrode layers 22B may configure the other electrode of a capacitor. Each of the plurality of dielectric layers 20 may configure a capacitor dielectric.

Although not illustrated, a peripheral structure, which includes a base substrate and a peripheral circuit defined on the base substrate, may be further included under the substrate 10. For example, the peripheral circuit may include a row decoder, a page buffer circuit, a control circuit, a voltage generator and an input/output circuit. The semiconductor device in accordance with the present disclosure may be provided as a PUC (peripheral under cell) structure. A contact may pass through the isolating insulation pattern 12 to be coupled to the first conductive pillar P1. The first conductive pillar P1 may be coupled to the peripheral circuit through the contact.

FIGS. 3 to 7 are top views illustrating various examples of arrangement structures of first and second conductive pillars of semiconductor devices in accordance with embodiments of the present disclosure.

Figure 3:
FIGS. 3 to 7 are top views illustrating various examples of arrangement structures of first and second conductive pillars of semiconductor devices in accordance with embodiments of the present disclosure.
Figure 3:
Figure 3:
Figure 3:

Referring to FIG. 3, first conductive pillars P1 and second conductive pillars P2 may be disposed in the form of a matrix having a plurality of rows and a plurality of columns.

The first conductive pillars P1 and the second conductive pillars P2 may be disposed in different rows. For example, the first conductive pillars P1 may be disposed in odd-numbered rows, and the second conductive pillars P2 may be disposed in even-numbered rows. In each column, the first conductive pillars P1 and the second conductive pillars P2 may be alternate with each other.

Figure 4:
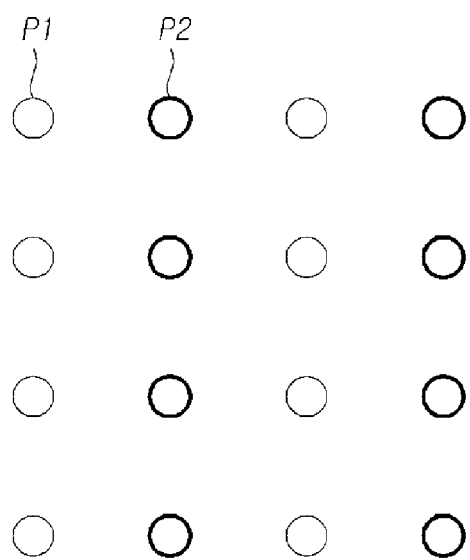

Referring to FIG. 4, the first conductive pillars P1 and the second conductive pillars P2 may be disposed in the form of a matrix having a plurality of rows and a plurality of columns.

The first conductive pillars P1 and the second conductive pillars P2 may be disposed in different columns. For example, the first conductive pillars P1 may be disposed in odd-numbered columns, and the second conductive pillars P2 may be disposed in even-numbered columns. In each row, the first conductive pillars P1 and the second conductive pillars P2 may be alternate with each other.

Figure 5:
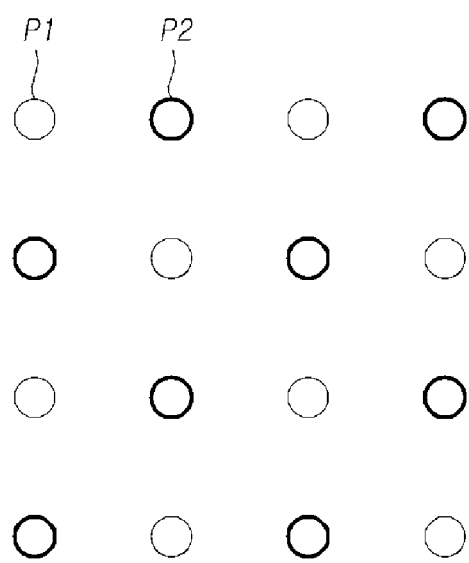

Referring to FIG. 5, the first conductive pillars P1 and the second conductive pillars P2 may be disposed in the form of a matrix having a plurality of rows and a plurality of columns. In all rows and columns, the first conductive pillars P1 and the second conductive pillars P2 may be disposed alternately with each other.

Figure 6:
Figure 6:
Figure 6:
Figure 6:

Referring to FIG. 6, the first conductive pillars P1 may be disposed in odd-numbered rows, and the second conductive pillars P2 may be disposed in even-numbered rows. Although not illustrated, conversely, the second conductive pillars P2 may be disposed in odd-numbered rows, and the first conductive pillars P1 may be disposed in even-numbered rows. That is to say, ones of the first conductive pillars P1 and the second conductive pillars P2 may be disposed in odd-numbered rows, and the others may be disposed in even-numbered rows.

The odd-numbered row and the even-numbered row may be offset from each other in a row direction. Accordingly, the centers of a first conductive pillar P1 and a second conductive pillar P2 that are adjacent to each other may be offset from each other in the row direction.

Figure 7:
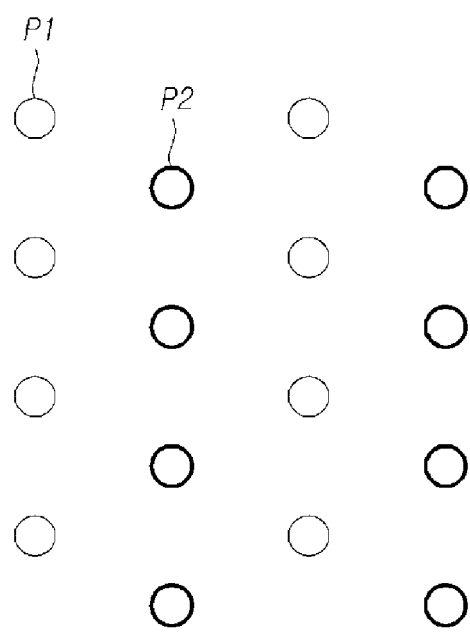

Referring to FIG. 7, the first conductive pillars P1 may be disposed in odd-numbered columns, and the second conductive pillars P2 may be disposed in even-numbered columns. Although not illustrated, conversely, the second conductive pillars P2 may be disposed in odd-numbered columns, and the first conductive pillars P1 may be disposed in even-numbered columns. That is to say, ones of the first conductive pillars P1 and the second conductive pillars P2 may be disposed in odd-numbered columns, and the others may be disposed in even-numbered columns.

The odd-numbered column and the even-numbered column may be offset from each other in a column direction. Accordingly, a centers of the first conductive pillar P1 and a second conductive pillar P2 that are adjacent to each other may be offset from each other in the column direction.

Figure 8:
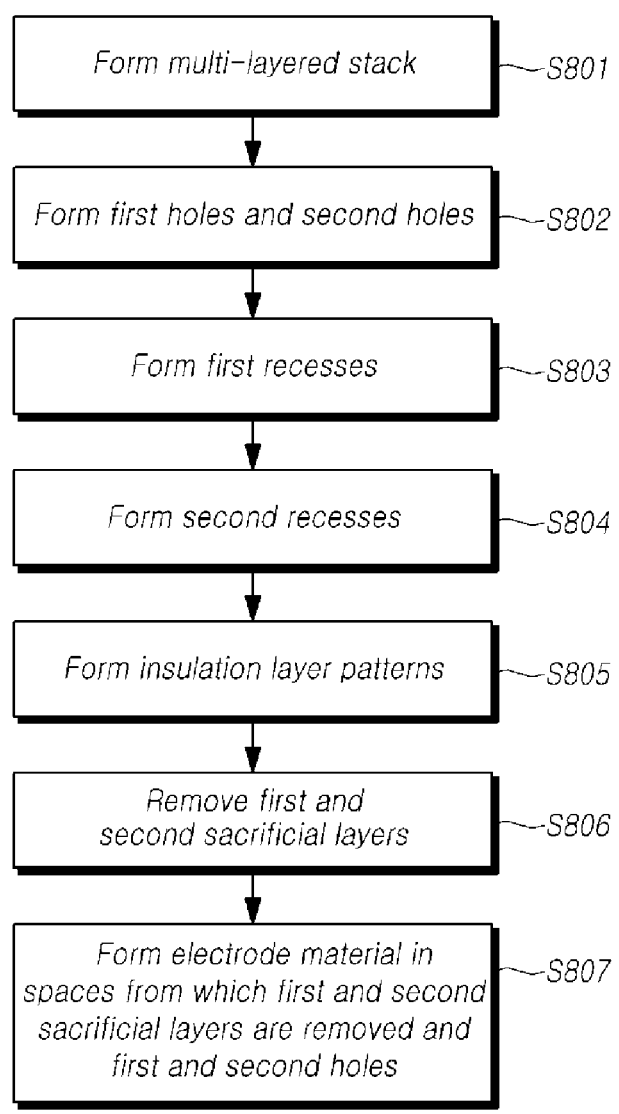
FIG. 8 is a flowchart illustrating a method for manufacturing a semiconductor device in accordance with an embodiment of the present disclosure.

FIG. 8 is a flowchart illustrating a method for manufacturing a semiconductor device in accordance with an embodiment of the present disclosure, and FIGS. 9A to 9I are cross-sectional views illustrating, by process steps, a semiconductor device in accordance with an embodiment of the present disclosure.

Figure 9A:
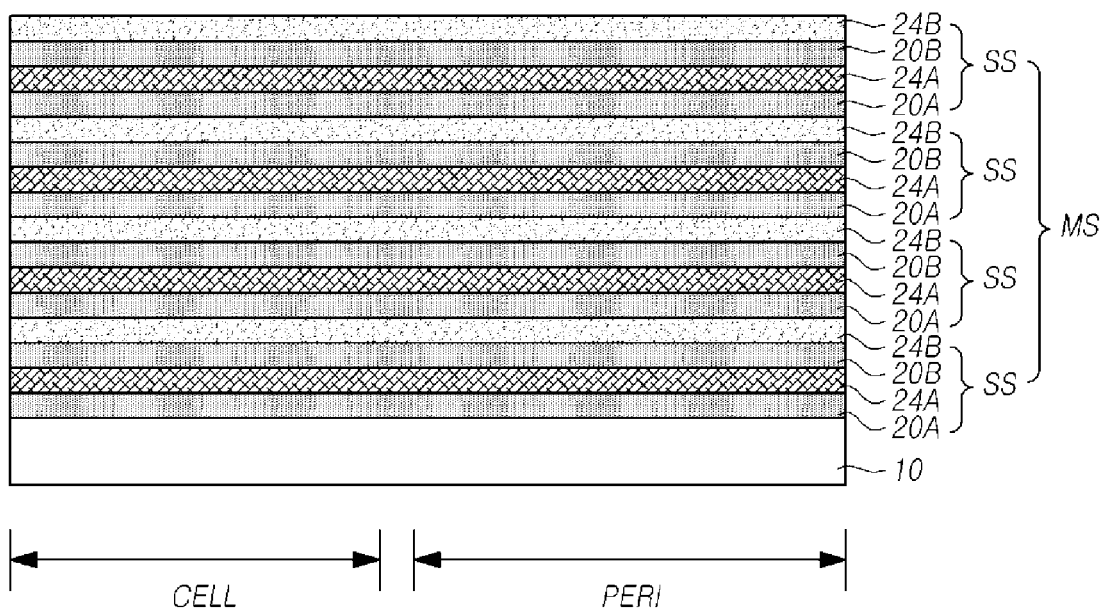
FIGS. 9A to 9I are cross-sectional views illustrating, by process steps, a semiconductor device in accordance with an embodiment of the present disclosure.
Figure 9B:
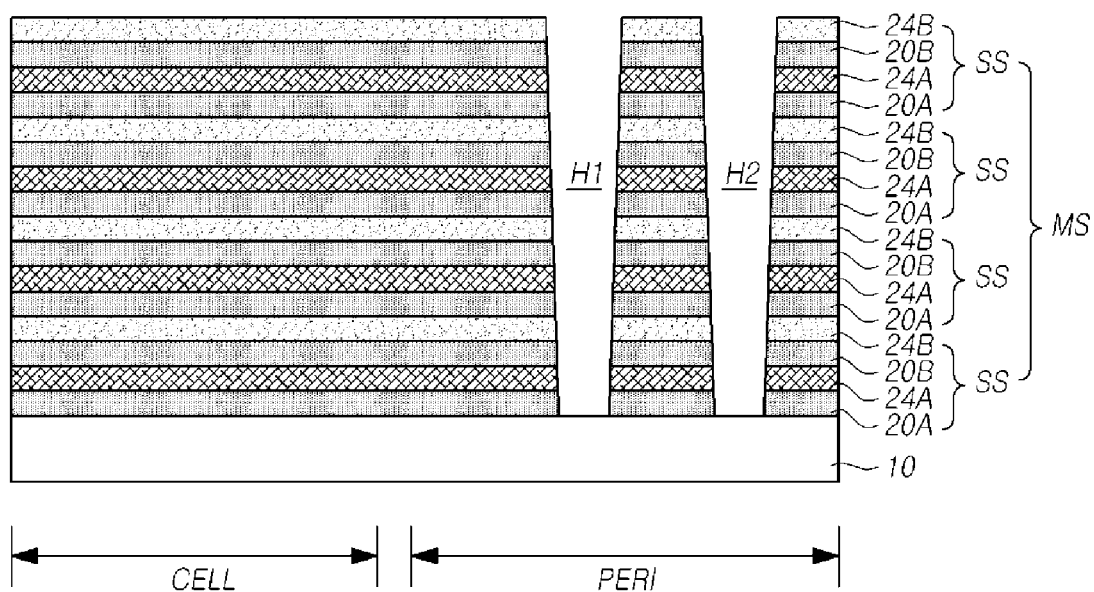
Figure 9C:
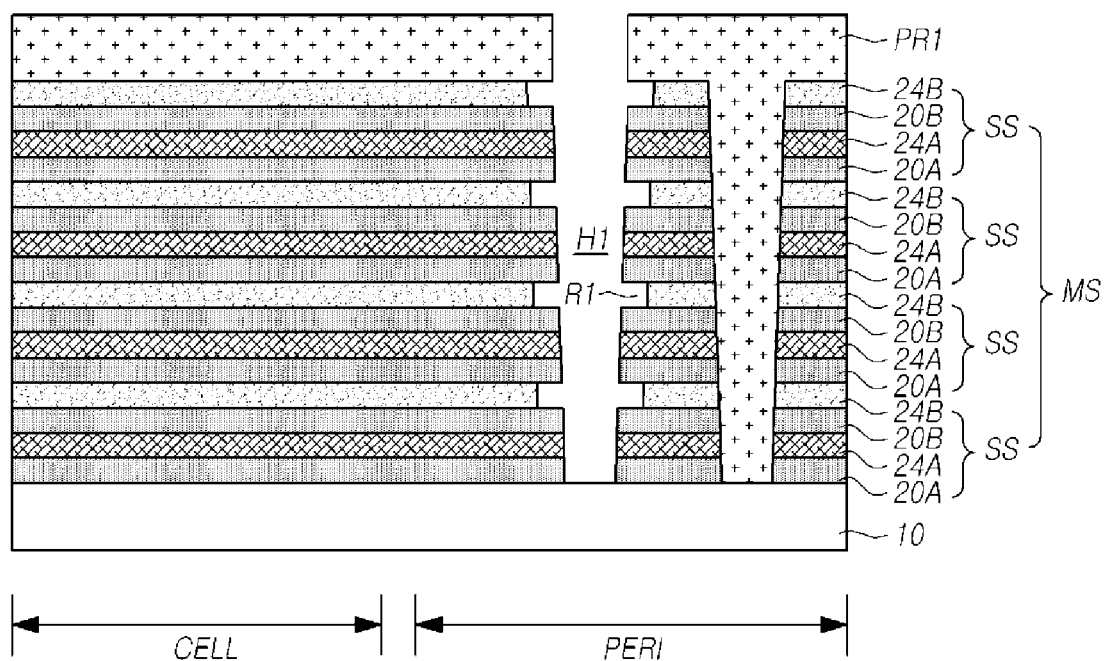
Figure 9D:
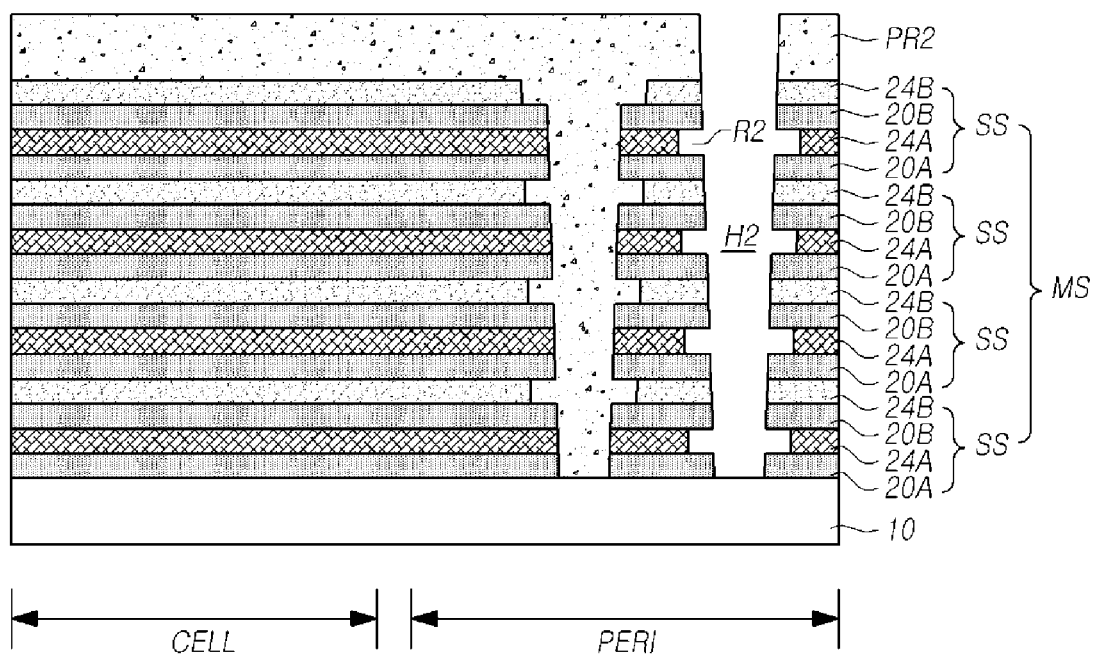
Figure 9E:
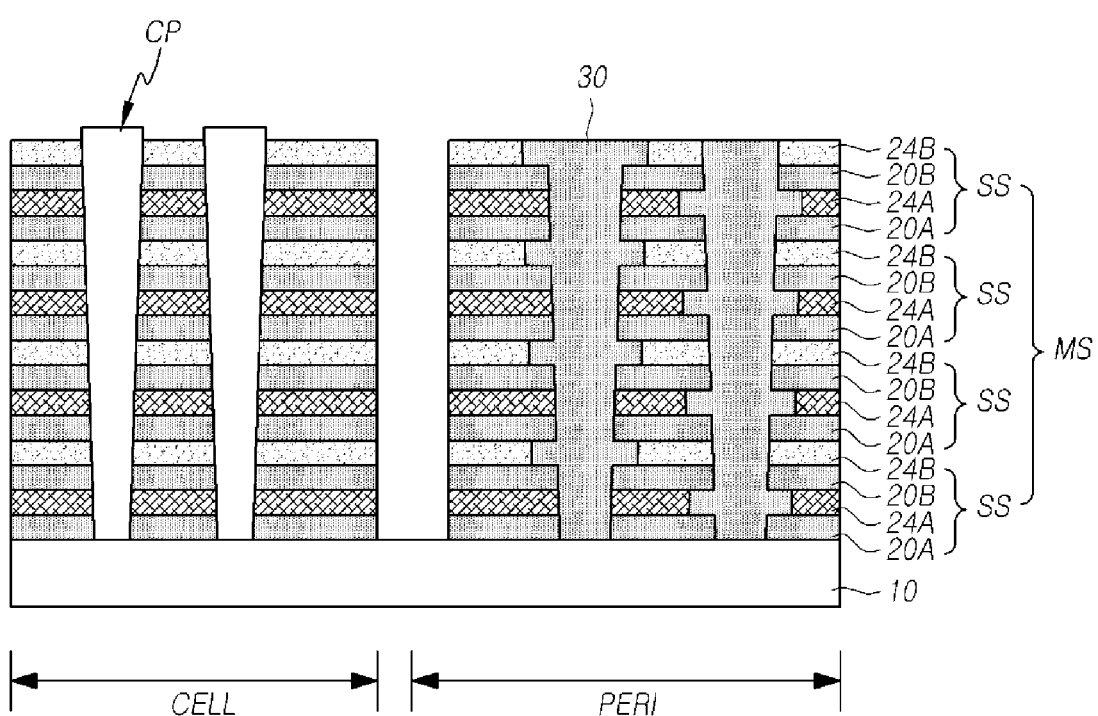
Figure 9F:
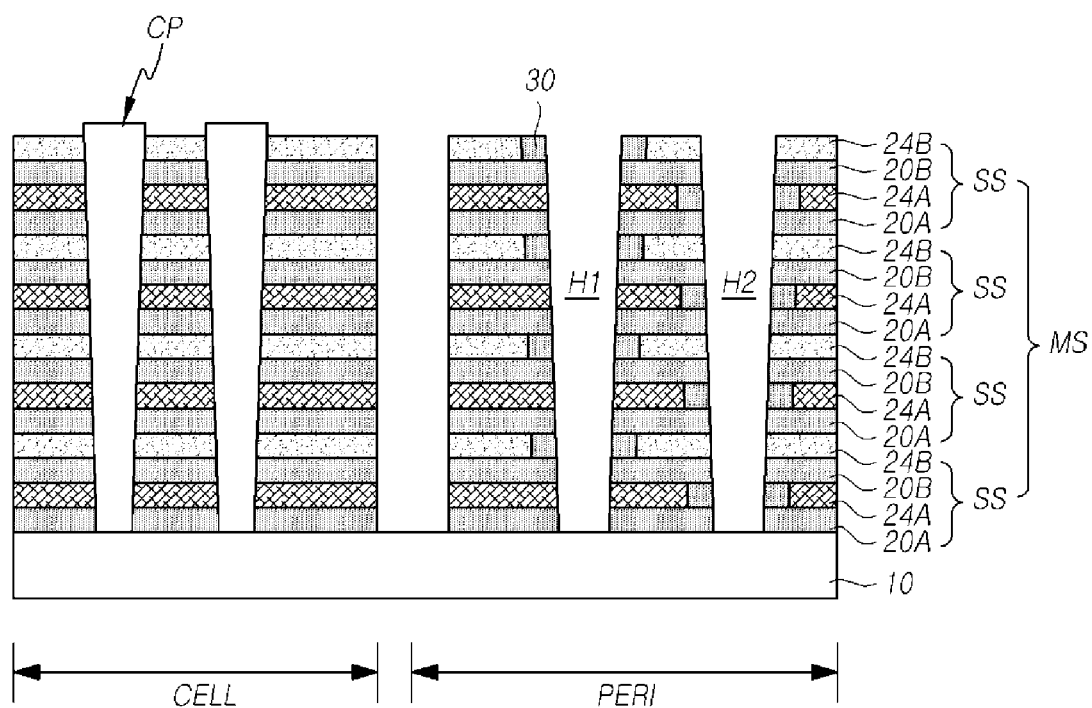
Figure 9G:
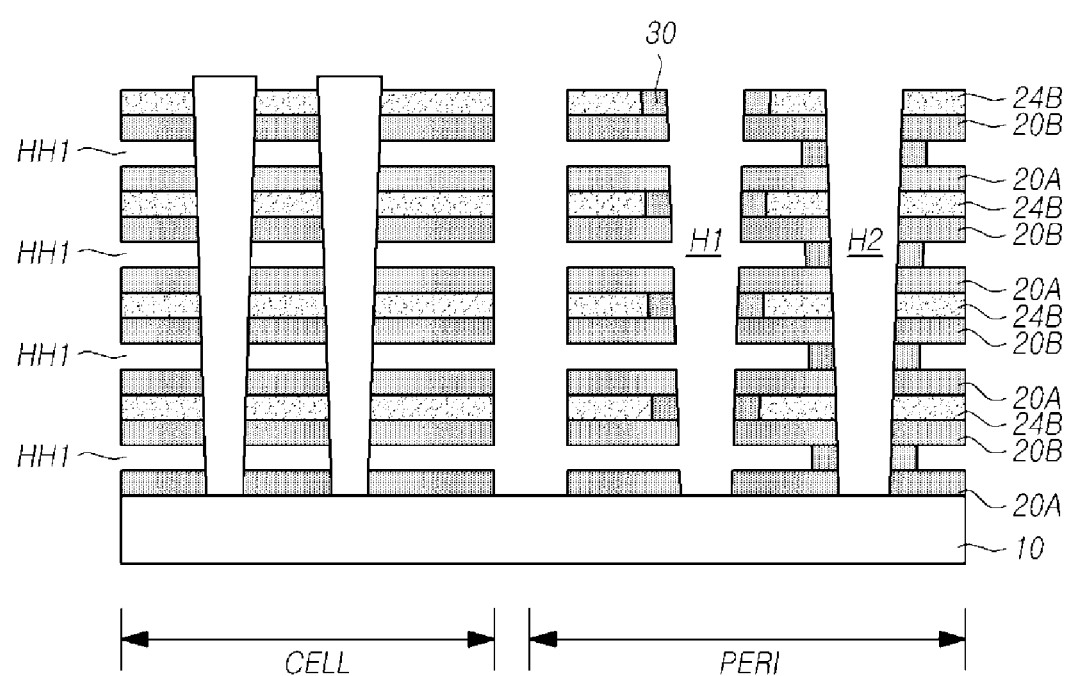
Figure 9H:
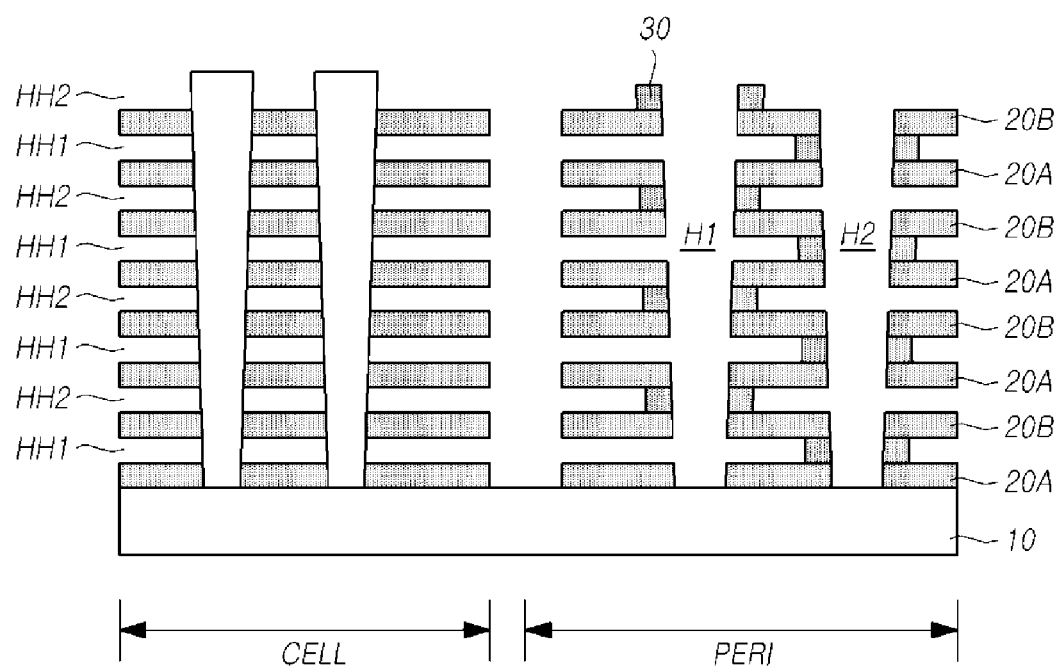
Figure 9I:
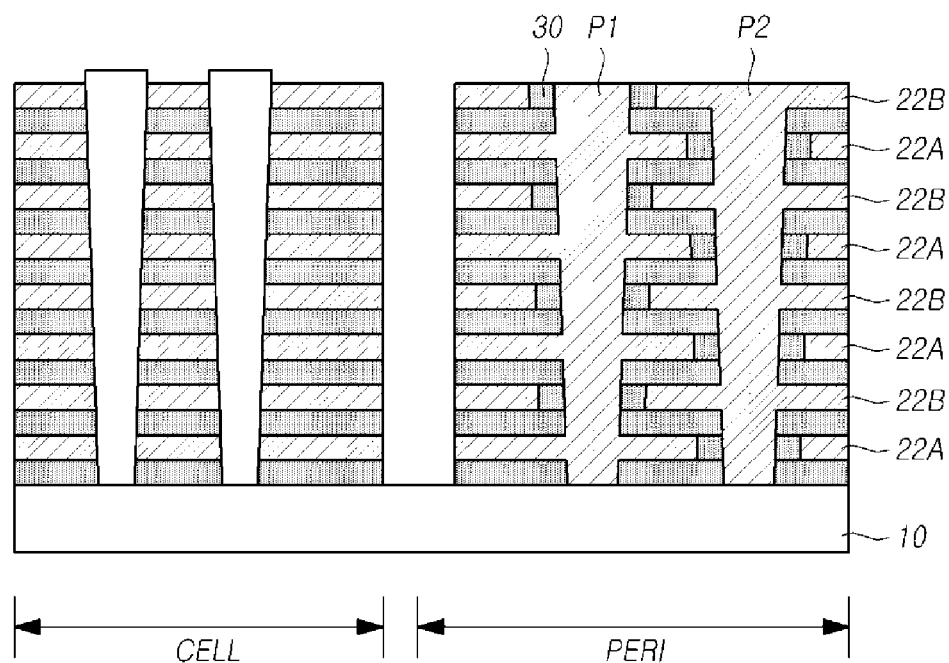

Referring to FIGS. 8 to 9I, a method for manufacturing a semiconductor device in accordance with an embodiment of the present disclosure may include forming a multi-layered stack MS by stacking, on a substrate 10, a plurality of unit structures SS in each of which a first interlayer dielectric layer 20A, a first sacrificial layer 24A, a second interlayer dielectric layer 20B and a second sacrificial layer 24B are stacked (S801); forming a first hole H1 and a second hole H2 passing through the multi-layered stack MS (S802); forming a plurality of first recesses R1 on the sidewall of the first hole H1 by removing second sacrificial layers 24B adjacent to the first hole H1 (S803); forming a plurality of second recesses R2 on the sidewall of the second hole H2 by removing first sacrificial layers 24A adjacent to the second hole H2 (S804); forming insulation layer patterns 30 in the plurality of first recesses R1 and the plurality of second recesses R2 (S805); removing the plurality of first sacrificial layers 24A and the plurality of second sacrificial layers 24B (S806); and forming an electrode material in spaces which are formed due to the removal of the plurality of first sacrificial layers 24A and the plurality of second sacrificial layers 24B and the first and second holes H1 and H2 (S807).

The method for manufacturing a semiconductor device in accordance with an embodiment of the present disclosure will be described below in more detail.

Referring FIG. 9A, the multi-layered stack MS is formed by stacking, on a cell region CELL and a peripheral region PERI of the substrate 10, the plurality of unit structures SS, each of which includes a first interlayer dielectric layer 20A, a first sacrificial layer 24A, a second interlayer dielectric layer 20B and a second sacrificial layer 24B that are stacked.

The substrate 10 may include a semiconductor material, for example, a group IV semiconductor, a group III-V compound semiconductor or a group II-VI compound semiconductor. The group IV semiconductor may include silicon, germanium or silicon-germanium. The substrate 10 may be provided as a polysilicon layer or an epitaxial layer. Although not illustrated, isolating insulation patterns may be additionally formed in the substrate 10.

The first and second interlayer dielectric layers 20A and 20B may be formed of an insulation material that has a different etch selectivity from the first and second sacrificial layers 24A and 24B. For example, the first and second interlayer dielectric layers 20A and 20B may be formed of silicon oxide. The first sacrificial layers 24A and the second sacrificial layers 24B may be formed of materials that have different etch selectivities.

Referring to FIG. 9B, the first hole H1 and the second hole H2, which vertically pass through the multi-layered stack MS, are formed in the peripheral region PERI. FIG. 9B illustrates for the sake of simplicity in illustration, that only one first hole H1 and only one second hole H2 are formed, but a plurality of first holes H1 and a plurality of second holes H2 may be formed in other embodiments.

Referring to FIG. 9C, a first mask pattern PR1 having an opening that exposes the first hole H1 is formed on the multi-layered stack MS.

By etching the second sacrificial layers 24B adjacent to the first hole H1 using an etchant capable of selectively etching the second sacrificial layers 24B, the plurality of first recesses R1 are formed on the sidewall of the first hole H1. As the etching proceeds, the first recesses R1 are enlarged from the sidewall of the first hole H1 in a horizontal direction parallel to the top surface of the substrate 10. When viewed from the top, the first recess R1 may have a ring shape that surrounds the first hole H1.

As described above, the first and second interlayer dielectric layers 20A and 20B and the first sacrificial layers 24A have different etch selectivities from the second sacrificial layers 24B, so the first and second interlayer dielectric layers 20A and 20B and the first sacrificial layers 24A will not be etched while the second sacrificial layers 24B are etched.

The first mask pattern PR1 may be formed using a photoresist, and the first mask pattern PR1 remaining after the first recesses R1 are formed may be removed using a strip process.

Referring to FIG. 9D, a second mask pattern PR2 having an opening that exposes the second hole H2 is formed on the multi-layered stack MS.

By etching the first sacrificial layers 24A adjacent to the second hole H2 using an etchant capable of selectively etching the first sacrificial layers 24A, the plurality of second recesses R2 are formed on the sidewall of the second hole H2. As the etching proceeds, the second recesses R2 are enlarged from the sidewall of the second hole H2 in the horizontal direction parallel to the top surface of the substrate 10. When viewed from the top, the second recess R2 may have a ring shape that surrounds the second hole H2.

As described above, the first and second interlayer dielectric layers 20A and 20B and the second sacrificial layers 24B have different etch selectivities from the first sacrificial layers 24A, so the first and second interlayer dielectric layers 20A and 20B and the second sacrificial layers 24B will not be etched while the first sacrificial layers 24A are etched.

The second mask pattern PR2 may be formed using a photoresist, and the second mask pattern PR2 remaining after the second recesses R2 are formed may be removed using a strip process.

Referring to FIG. 9E, the insulation layer patterns 30 filling the first recesses R1, the second recesses R2, the first hole H1 and the second hole H2 are formed.

The insulation layer patterns 30 may be formed of an insulation material that has a different etch selectivity from the first and second sacrificial layers 24A and 24B. For example, the insulation layer patterns 30 may be formed of silicon oxide.

A plurality of cell plugs CP that pass through the cell region CELL of the multi-layered stack MS to extend to the substrate 10 are formed, and the cell region CELL and the peripheral region PERI of the multi-layered stack MS may be separated through an etching process.

Although the embodiment described with reference to the drawings illustrates that the process of forming the cell plugs CP and the process of separating the cell region CELL and the peripheral region PERI of the multi-layered stack MS are performed after the insulation layer patterns 30 are formed, the present disclosure is not limited thereto. The process of forming the cell plugs CP and the process of separating the cell region CELL and the peripheral region PERI of the multi-layered stack MS may be performed before removal of the first sacrificial layers 24A and the second sacrificial layers 24B, to be described later with reference to FIGS. 9G and 9H.

Referring to FIG. 9F, by removing the insulation layer patterns 30 filled in the first hole H1 and the second hole H2 while leaving the insulation layer patterns 30 filled in the first recesses R1 and the second recesses R2, the first hole H1 and the second hole H2 are reopened or re-established.

Referring to FIG. 9G, the first sacrificial layers 24A are removed using an etchant capable of selectively removing the first sacrificial layers 24A. As the first sacrificial layers 24A are removed, first horizontal spaces HH1 are formed between the first interlayer dielectric layers 20A and the second interlayer dielectric layers 20B that are adjacent to each other. The first horizontal spaces HH1 of the peripheral region PERI communicate with the first hole H1, but do not communicate with the second hole H2 due to the presence of the insulation layer patterns 30.

Referring to FIG. 9H, the second sacrificial layers 24B are removed using an etchant capable of selectively removing the second sacrificial layers 24B. As the second sacrificial layers 24B are removed, second horizontal spaces HH2 are formed between the second interlayer dielectric layers 20B and the first interlayer dielectric layers 20A that are adjacent to each other. The second horizontal spaces HH2 of the peripheral region PERI communicate with the second hole H2, but do not communicate with the first hole H1 due to the presence of the insulation layer patterns 30.

Although the present embodiment illustrates the removal of the first sacrificial layers 24A before removing the second sacrificial layers 24B, the reverse order is also possible in some embodiments.

Referring to FIG. 9I, by filling an electrode material in the first and second horizontal spaces HH1 and HH2 and the first and second holes H1 and H2, cell electrode layers (42 of FIG. 2) are formed in the cell region CELL, and capacitor first and second electrode layers (22A and 22B of FIG. 2) and first and second conductive pillars P1 and P2 are formed in the peripheral region PERI.

According to embodiments of the present disclosure, by configuring capacitors using the dielectric layers 20 and the electrode layers 22A and 22B, which are three-dimensionally stacked, the effective area of each capacitor may be increased, and thus, it is possible to form a capacitor having high capacitance within a small area.

In addition, since the capacitors are formed in the peripheral region PERI by using a process of forming memory cells in the cell region CELL, when compared to a case in which capacitors are formed by a separate process from memory cells, the number of processes and the number of masks added for manufacturing the capacitors may be reduced, and thus, the manufacturing cost of the capacitors may be reduced.

Figure 10:
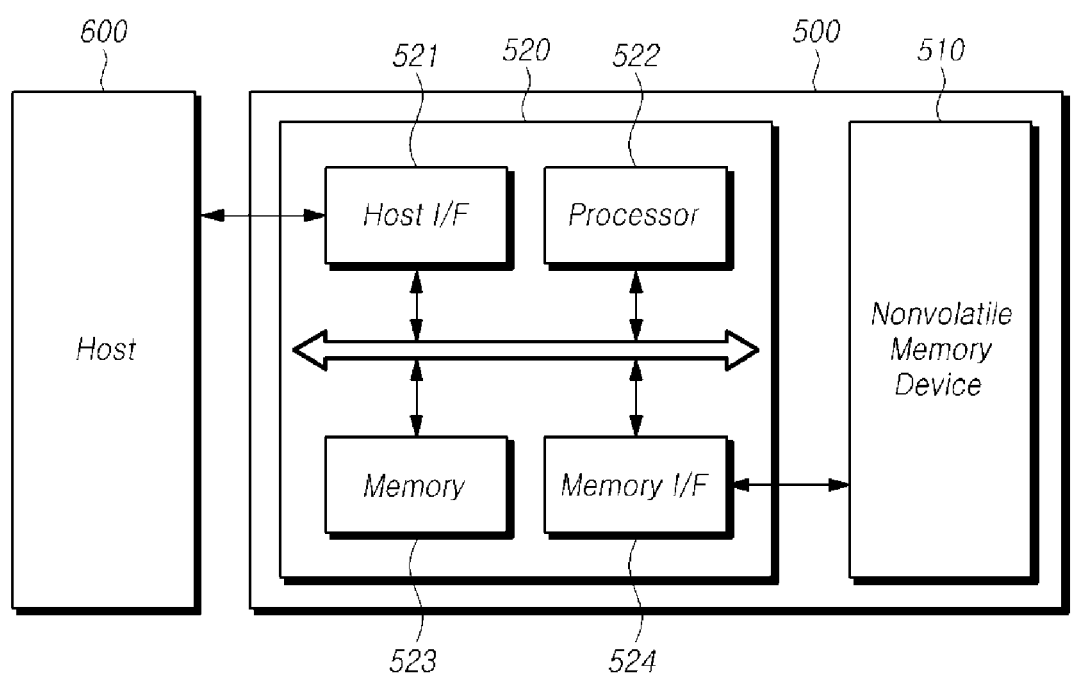
FIG. 10 is a block diagram schematically illustrating a memory system including the semiconductor device in accordance with an embodiment of the present disclosure.

FIG. 10 is a block diagram schematically illustrating a memory system including a semiconductor device in accordance with an embodiment of the present disclosure.

Referring to FIG. 10, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 10 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the semiconductor device according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface Host I/F 521, a processor 522, the memory 523 and a memory interface Memory I/F 524. Although not illustrated in FIG. 10, the controller 520 may further include an ECC (error correction code) engine, which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 11:
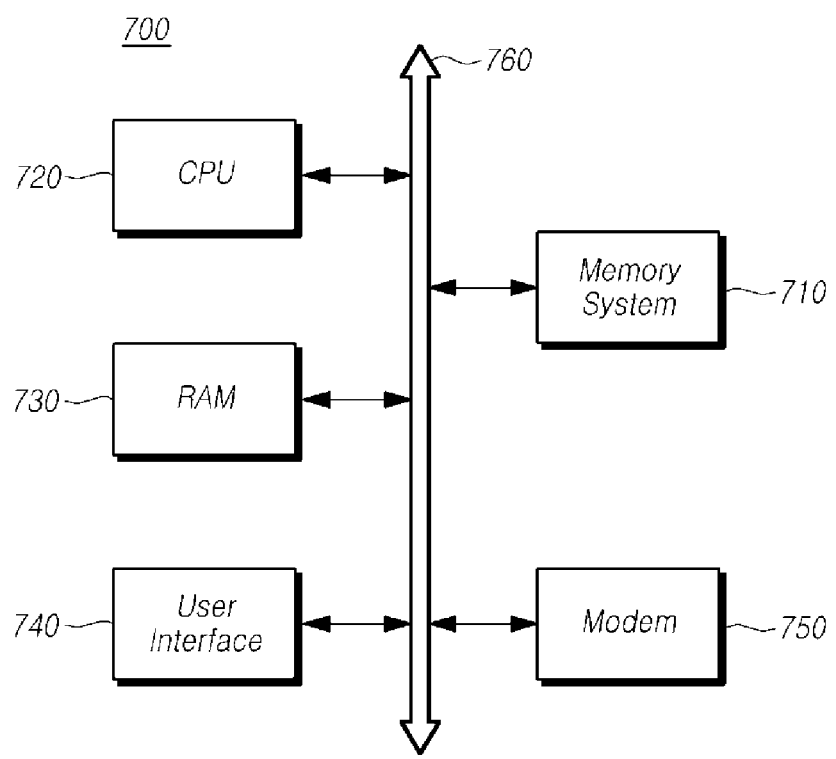
FIG. 11 is a block diagram schematically illustrating a computing system including a memory device in accordance with embodiments of the present disclosure.

FIG. 11 is a block diagram schematically illustrating a computing system including a memory device in accordance with embodiments of the present disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor device comprising:
   a stack including a plurality of electrode layers that include a plurality of capacitor first electrode layers and a plurality of capacitor second electrode layers alternately stacked on a substrate and a plurality of dielectric layers which are disposed between the capacitor first electrode layers and the capacitor second electrode layers;
   a first conductive pillar passing through the stack and coupled to the plurality of capacitor first electrode layers;
   a second conductive pillar passing through the stack and coupled to the plurality of capacitor second electrode layers; and
   a plurality of insulation layer patterns insulating the first conductive pillar and the plurality of capacitor second electrode layers from each other and insulating the second conductive pillar and the plurality of capacitor first electrode layers from each other,
   wherein an outer wall of the first conductive pillar is not surrounded by the plurality of insulation layer patterns at the same layers as the plurality of capacitor first electrode layers,
   wherein the plurality of capacitor first electrode layers are in contact with the outer wall of the first conductive pillar, wherein an outer wall of the second conductive pillar is not surrounded by the plurality of insulation layer patterns at the same layers as the plurality of capacitor second electrode layers, wherein the plurality of capacitor second electrode layers are in contact with the outer wall of the second conductive pillar.

2. The semiconductor device according to claim 1, wherein the pluralities of capacitor first and second electrode layers and the first and second conductive pillars are formed of the same conductive material.

3. The semiconductor device according to claim 1, wherein the plurality of insulation layer patterns comprises:
a plurality of first insulation layer patterns disposed at the same layers as the plurality of capacitor second electrode layers, and surrounding the outer wall of the first conductive pillar; and
a plurality of second insulation layer patterns disposed at the same layers as the plurality of capacitor first electrode layers, and surrounding the outer wall of the second conductive pillar.

4. The semiconductor device according to claim 1, wherein a first voltage is applied to the first conductive pillar, and a second voltage different from the first voltage is applied to the second conductive pillar.

5. The semiconductor device according to claim 4, wherein the first voltage is a power supply voltage, and the second voltage is a ground voltage.

6. The semiconductor device according to claim 1, further comprising:
an isolating insulation pattern passing through the substrate,
wherein the first conductive pillar is coupled to the isolating insulation pattern, and the second conductive pillar is coupled to the substrate.

7. A semiconductor device comprising:
a first stack including a plurality of cell electrode layers and a plurality of interlayer dielectric layers that are alternately stacked on a cell region of a substrate;
a plurality of cell plugs passing through the first stack to extend to the substrate;
a second stack including a plurality of capacitor electrode layers that include a plurality of capacitor first electrode layers and a plurality of capacitor second electrode layers alternately stacked on a peripheral region of the substrate, and a plurality of dielectric layers that are disposed between alternating capacitor electrode layers;
a plurality of first conductive pillars passing through the second stack, and coupled to the plurality of capacitor first electrode layers;
a plurality of second conductive pillars passing through the second stack, and coupled to the plurality of capacitor second electrode layers;
a plurality of first insulation layer patterns insulating the plurality of first conductive pillars and the plurality of capacitor second electrode layers from each other; and
a plurality of second insulation layer patterns insulating the plurality of second conductive pillars and the plurality of capacitor first electrode layers from each other,
wherein the plurality of capacitor first electrode layers are in contact with outer walls of the plurality of first conductive pillars,
wherein, at each of the plurality of capacitor first electrode layers, the outer walls of the plurality of first conductive pillars are not surrounded by the plurality of first insulation layer patterns and the outer walls of the plurality of first conductive pillars are not in contact with the plurality of second insulation layer patterns common to the same capacitor first electrode layer, wherein the plurality of capacitor second electrode layers are in contact with outer walls of the plurality of second conductive pillars, and wherein, at each of the plurality of capacitor second electrode layers, the outer walls of the plurality of second conductive pillars are not surrounded by the plurality of second insulation layer patterns and the outer walls of the plurality of second conductive pillars are not in contact with the plurality of first insulation layer patterns common to the same capacitor second electrode layer.

8. The semiconductor device according to claim 7, wherein the plurality of cell electrode layers, the plurality of capacitor electrode layers and the pluralities of first and second conductive pillars are formed of the same conductive material.

9. The semiconductor device according to claim 7, wherein the plurality of interlayer dielectric layers and the plurality of dielectric layers are formed of the same insulation material.

10. The semiconductor device according to claim 7, wherein from a top view,
the plurality of first conductive pillars and the plurality of second conductive pillars are disposed in different rows, and
the first conductive pillars and the second conductive pillars are disposed respectively in alternating columns.

11. The semiconductor device according to claim 7, wherein from a top view,
the plurality of first conductive pillars and the plurality of second conductive pillars are disposed in different columns, and
in each row, the first conductive pillars and the second conductive pillars are disposed alternately with each other.

12. The semiconductor device according to claim 7, wherein from a top view,
the pluralities of first and second conductive pillars are disposed in a form of a matrix having a plurality of rows and a plurality of columns, and
in all rows and columns, the first conductive pillars and the second conductive pillars are disposed alternately with each other.

13. The semiconductor device according to claim 7, wherein from a top view,
any ones of the plurality of first conductive pillars and the plurality of second conductive pillars are disposed in odd-numbered rows, and the others are disposed in even-numbered rows, and
the odd-numbered rows and the even-numbered rows are offset from each other in a row direction.

14. The semiconductor device according to claim 7, wherein from a top view,
any ones of the plurality of first conductive pillars and the plurality of second conductive pillars are disposed in odd-numbered columns, and the others are disposed in even-numbered columns, and
the odd-numbered columns and the even-numbered columns are offset from each other in a column direction.

* * * * *